US010379146B2

(12) United States Patent
Bandyopadhyay et al.

(10) Patent No.: US 10,379,146 B2
(45) Date of Patent: Aug. 13, 2019

(54) DETECTING NON-TECHNICAL LOSSES IN ELECTRICAL NETWORKS BASED ON MULTI-LAYERED STATISTICAL TECHNIQUES FROM SMART METER DATA

(71) Applicants: International Business Machines Corporation, Armonk, NY (US); Universiti Brunei Darussalam, Gadong (BN)

(72) Inventors: Sambaran Bandyopadhyay, West Bengal (IN); Zainul Charbiwala, Bangalore (IN); Tanuja Ganu, Bangalore (IN); Pg Dr M. Iskandar Pg Hj Petra, Jalan Muara (BN)

(73) Assignees: International Business Machines Corporation, Armonk, NY (US); Universiti Brunei Darussalam, Muara (BN)

( * ) Notice: Subject to any disclaimer, the term of this patent is extended or adjusted under 35 U.S.C. 154(b) by 755 days.

(21) Appl. No.: 14/862,487

(22) Filed: Sep. 23, 2015

(65) Prior Publication Data

US 2017/0082665 A1 Mar. 23, 2017

(51) Int. Cl.
*G01R 22/10* (2006.01)
*G01D 4/00* (2006.01)
(Continued)

(52) U.S. Cl.
CPC ............. *G01R 22/10* (2013.01); *G01D 4/004* (2013.01); *G01R 19/2513* (2013.01);
(Continued)

(58) Field of Classification Search
CPC .................................................... G01R 21/133
(Continued)

(56) References Cited

U.S. PATENT DOCUMENTS 7,936,163 B2 5/2011 Lee, Jr.
8,731,724 B2 5/2014 Drees et al.
(Continued)

FOREIGN PATENT DOCUMENTS

CN 103559576 A 2/2014

OTHER PUBLICATIONS

US 2015/0046378 A1, 02/2015, Siebel et al. (withdrawn)
(Continued)

*Primary Examiner* — Alexander Sofocleous
*Assistant Examiner* — Alfredo Bermudez Lozada
(74) *Attorney, Agent, or Firm* — Ryan, Mason & Lewis, LLP

(57) ABSTRACT

Methods, systems, and computer program products for detecting losses in electrical networks are provided herein. A computer-implemented method includes computing a consumption estimation for each consumer associated with a network; determining a difference between (i) the consumption estimation and (ii) actual consumption for each consumer; clustering the consumers into a cluster based on a consumption pattern associated with each consumer; determining a level of deviation of (i) the consumption pattern associated with each consumer from (ii) a consumption pattern representative of the cluster; clustering the consumers into two or more clusters based on a consumption pattern during a first interval of time and during a second interval of time; determining, for each consumer, a level of evolution from (i) a first cluster during the first interval to (ii) a second cluster during the second interval; and identifying consumers associated with a given loss within the network.

17 Claims, 6 Drawing Sheets

(51) Int. Cl.
*G01R 19/25* (2006.01)
*G01R 22/06* (2006.01)

(52) U.S. Cl.
CPC .......... *G01R 22/063* (2013.01); *G01R 22/066* (2013.01); *Y02B 90/242* (2013.01); *Y04S 20/322* (2013.01)

(58) Field of Classification Search
USPC .......................................................... 702/62
See application file for complete search history.

(56) References Cited

U.S. PATENT DOCUMENTS

| | | | |
|---|---|---|---|
| 8,768,795 | B2 | 7/2014 | Garrity et al. |
| 8,972,066 | B2 | 3/2015 | Anderson et al. |
| 2008/0109387 | A1 | 5/2008 | Deaver et al. |
| 2010/0007336 | A1 | 1/2010 | de Buda |
| 2013/0289904 | A1 | 10/2013 | Marwah et al. |
| 2013/0297239 | A1 | 11/2013 | Arya et al. |
| 2013/0297241 | A1 | 11/2013 | Arya et al. |
| 2014/0163759 | A1 | 6/2014 | Anderson et al. |
| 2014/0280208 | A1 | 9/2014 | McConky et al. |
| 2014/0358839 | A1* | 12/2014 | Dhurandhar ............. G01D 4/00 706/48 |
| 2015/0149396 | A1* | 5/2015 | Arya ........................ G06N 5/04 706/46 |

OTHER PUBLICATIONS

Depuru et al. "Smart Meters for Power Grid-Challenges,Issues,Advantages and Status", IEEE 2011 (Year: 2011).*
Gandhi et al. "Smart Metering in Electric Power Distribution System", IEEE 2013 (Year: 2013).*
Jiguparmar "Difference between Power Transformer and Distribution Transformer", Electrical Engineering Portal, Aug. 27, 2011 (Year: 2011).*
Gupta et al., Integrating Community Matching and Outlier Detection for Mining Evolutionary Community Outliers. KDD'12, Aug. 12-16, 2012.
Nagi et al., Nontechnical Loss Detection for Metered Customers in Power Utility Using Support Vector Machines. IEEE Transactions on Power Delivery (vol. 25, Issue: 2), Oct. 2009.
McLaughlin et al., AMIDS: A Multi-Sensor Energy Theft Detection Framework for Advanced Metering Infrastructures. 2012 IEEE SmartGridComm. Nov. 2012.
Depuru, S., Modeling, Detection, and Prevention of Electricity Theft for Enhanced Performance and Security of Power Grid. The University of Toledo. 2012.
Arya et al., Loss Localization in Smart Distribution Network. 2014 Sixth International Conference on Communication Systems and Networks (COMSNETS), Jan. 2014.
Smith, T., Electricy Theft: a comparative analysis. Energy Policy 32 (2004) 2067-2076.
Jaussaud, D., Regulatory and Industry Practices to Reduce Losses, Public Utility Commission of Texas, Aug. 2014.
Fred, A., 2001. Finding Consistent Clusters in Data Partitions. In Proceedings of the Second International Workshop on Multiple Classifier Systems (MCS 2001).
Babu et al., 1993. A near-optimal initial seed value selection in K-means algorithm using a genetic algorithm. Pattern Recogn. Lett. 14, 10 (Oct. 1993), 763-769.
Ostrovsky et al., (Oct. 2006). The effectiveness of Lloyd-type methods for the k-means problem. 47th Annual IEEE Symposium on Foundations of Computer Science, 2006. (pp. 165-176).
Khan et al., 2004. Cluster center initialization algorithm for K-means clustering. Pattern Recogn. Left. 25, 11 (Aug. 2004), 1293-1302.
Zadeh et al., 2009. A uniqueness theorem for clustering. In Proceedings of the Twenty-Fifth Conference on Uncertainty in Artificial Intelligence (UAI '09). AUAI Press, 639-646.

* cited by examiner

DETECTING NON-TECHNICAL LOSSES IN ELECTRICAL NETWORKS BASED ON MULTI-LAYERED STATISTICAL TECHNIQUES FROM SMART METER DATA

FIELD

The present application generally relates to information technology, and, more particularly, to management techniques of electrical networks.

BACKGROUND

Anomaly detection commonly refers to detecting objects with behavior that deviates (perhaps significantly) from expected behavior. Within the context of electrical networks, anomaly detection can include, for example, detecting theft which is intentionally caused by one or more consumers in the electrical network, or detecting any other abnormal behavior which may be caused by mechanical damage in the network.

Additionally, within the context of electrical networks, non-technical losses can cause an unexpected consumption of electricity, significant loss for utilities, and/or a rise in electricity price which can create a burden for consumers. Non-technical losses in an electricity distribution network, as used herein, can include electricity theft as well as losses due to malfunctioning of electrical equipment, poor maintenance, and/or other unexpected behavior causing abnormal power consumption and waste. Existing detection approaches face challenges in detecting non-technical losses due, for example, to the large size of distribution networks in terms of the number of consumers and the total physical span of the networks. Additional challenges are presented due, for example, to the different methods that can be used in electricity theft such as tampering, bypassing the meters, hooking from the line etc., which can be difficult to detect other than by manual inspection by a human expert.

SUMMARY

In one embodiment of the present invention, techniques for detecting non-technical losses in electrical networks based on multi-layered techniques from smart meter data are provided. An exemplary computer-implemented method can include computing a consumption estimation for each of multiple consumers associated with an electrical distribution network based on a plurality of items of input data, wherein said computing is carried out by at least one computing device communicatively linked to (i) a plurality of smart meters monitoring electrical usage of the multiple consumers within the electrical distribution network and (ii) one or more additional data sources. The method also includes determining a difference between (i) the consumption estimation for each of the multiple consumers and (ii) actual consumption for each of the multiple consumers. Further, the method includes clustering the multiple consumers into one or more clusters based on a consumption pattern associated with each of the multiple consumers at a given point in time, and determining a level of deviation of (i) the consumption pattern associated with each of the multiple consumers at the given point in time from (ii) a consumption pattern representative of the cluster to which each of the multiple consumers belongs. The method also includes clustering the multiple consumers into two or more clusters based on a consumption pattern associated with each of the multiple consumers during a first interval of time, clustering the multiple consumers into the two or more clusters based on a consumption pattern associated with each of the multiple consumers during a second interval of time, and determining, for each of the multiple consumers, a level of evolution from (i) a first of the two of more clusters during the first interval of time to (ii) a second of the two or more clusters during the second interval of time. Additionally, the method includes identifying one or more of the multiple consumers associated with a given type of loss within the electrical distribution network based on (i) the determined difference, (ii) the determined level of deviation, and (iii) the determined level of evolution.

Another embodiment of the invention or elements thereof can be implemented in the form of an article of manufacture tangibly embodying computer readable instructions which, when implemented, cause a computer to carry out a plurality of method steps, as described herein. Furthermore, another embodiment of the invention or elements thereof can be implemented in the form of an apparatus including a memory and at least one processor that is coupled to the memory and configured to perform noted method steps. Yet further, another embodiment of the invention or elements thereof can be implemented in the form of means for carrying out the method steps described herein, or elements thereof; the means can include hardware module(s) or a combination of hardware and software modules, wherein the software modules are stored in a tangible computer-readable storage medium (or multiple such media).

These and other objects, features and advantages of the present invention will become apparent from the following detailed description of illustrative embodiments thereof, which is to be read in connection with the accompanying drawings.

DETAILED DESCRIPTION

As described herein, an embodiment of the present invention includes detecting anomalies in electrical networks using smart meter data. At least one embodiment of the invention includes implementing multi-layered statistical and machine learning techniques to detect anomalies in an electrical distribution network using smart meter data and knowledge pertaining to the electrical distribution network. An example multilayered statistical approach can be based on input data such as energy consumption from smart meter data for individual consumers, real-time energy consumption from distribution transformers, as well as external information include calendar context information, weather context information, consumer demographic information, etc. Additionally, an example multilayered statistical approach can also be based on an internal feedback mechanism among different layers to dynamically tune one or more learning algorithms.

At least one embodiment of the invention also includes detecting the location of one or more anomalies in an electrical distribution network based on the network structure and the energy flow, as well as determining and/or predicting the expected load for individual consumers based on past consumption data. Additionally, one or more embodiments of the invention include calculating an anomaly score for each detected anomaly based on a difference between predicted energy consumption and original or actual energy consumption from the individual consumer, a deviation from a consumption pattern with respect to a given cluster, and/or an unexpected change in a given cluster of an individual consumer over time.

As also detailed herein, at least one embodiment of the invention can include implementing human inspection to verify one or more detected anomalies (as detected by the algorithm) and incorporating feedback in accordance with the inspection result to minimize the false positive rate over time, for example, via learning the relative weights of different layers to compute the final anomaly score.

By way of illustration, one or more example embodiments (such as detailed herein in connection with FIG. 3) described herein utilize the following designations with respect to an electrical distribution network: a utility company is referred to as Level 0; distribution transformers are referred to as Level 1; and individual consumers are referred to as Level 2.

Figure 1:
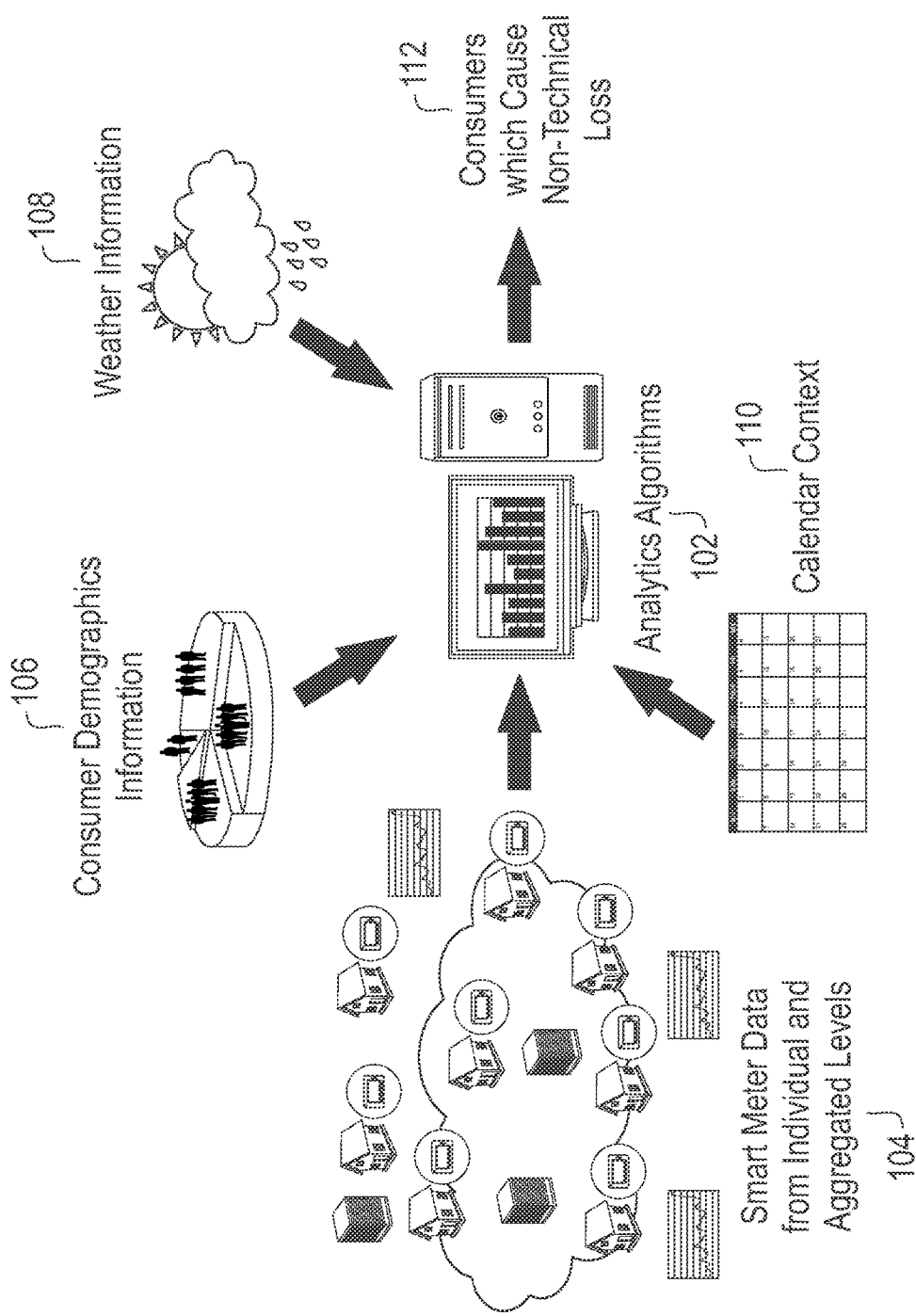
FIG. 1 is a diagram illustrating system architecture, according to an example embodiment of the invention.

FIG. 1 is a diagram illustrating system architecture, according to an embodiment of the invention. By way of illustration, FIG. 1 depicts input for one or more multi-layered statistical and machine learning algorithms 102 that includes smart meter data 104, which can include data for each consumer positioned at Level 2 of the network as well as data from nodes positioned at Level 1 and/or Level 2 of the network. As used herein, node is a standard term in graph theory, as would be understood by one skilled in the art. In one or more embodiments of the invention, the vertices of a tree are referred to by nodes. The input can also include external context information including calendar context information 110, weather context information 108, and consumer demographic information 106. Based on such inputs, the one or more multi-layered statistical and machine learning algorithms 102 implemented in at least one embodiment of the invention can output an identification 112 of one or more anomalous consumers within the network whose behavior in consuming electricity is unexpected and/or different from similar type of consumers, and/or who are the cause of one or more non-technical losses.

Figure 2:
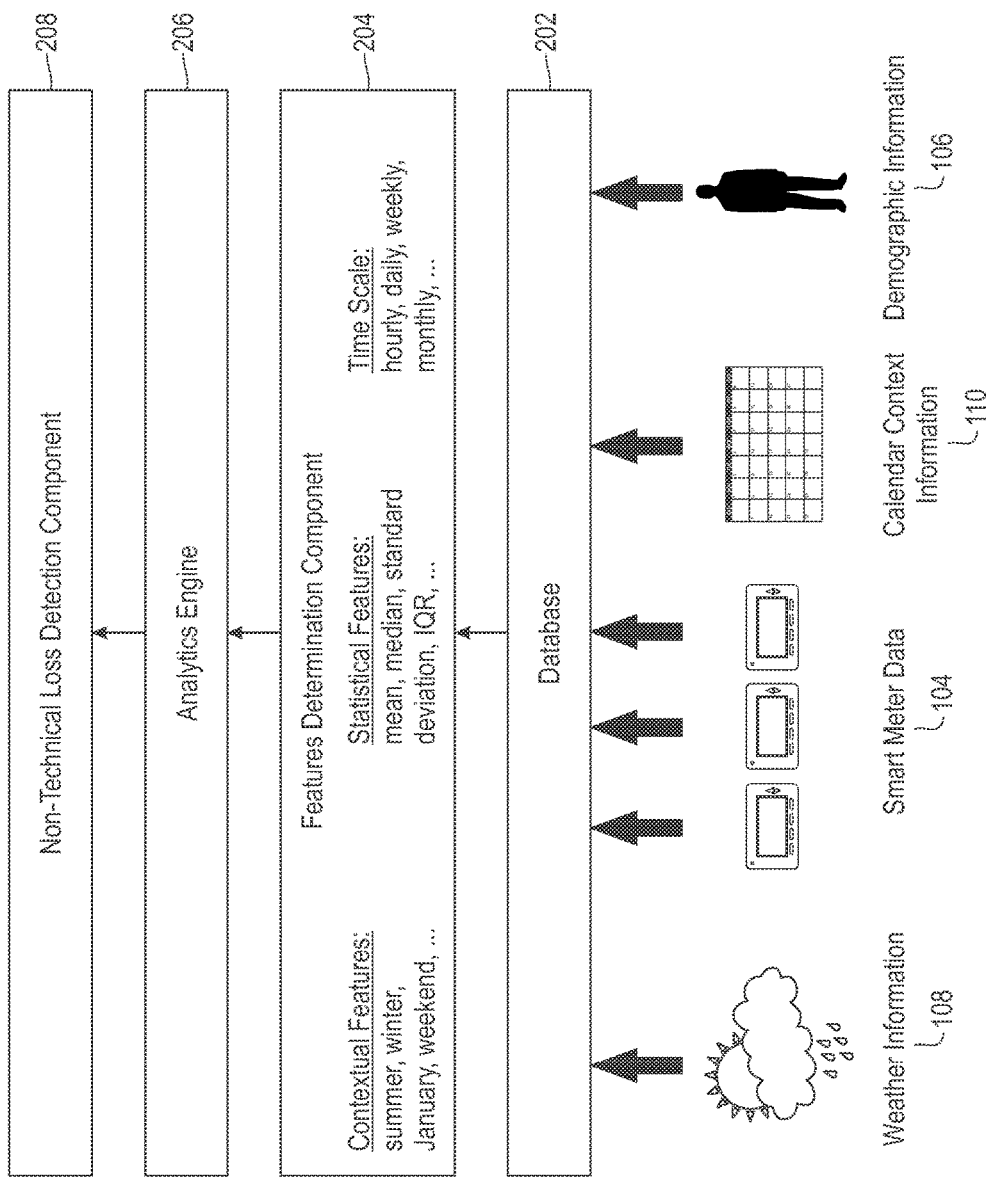
FIG. 2 is a diagram illustrating system architecture, according to an example embodiment of the invention.

FIG. 2 is a diagram illustrating system architecture, according to an example embodiment of the invention. By way of illustration, FIG. 2 depicts smart meter data 104, calendar context information 110, weather context information 108, and consumer demographic information 106 transmitted to a database 202. The database provides such input data to a features determination component 204, wherein the input data are analyzed to determine one or more features therein and/or related thereto. Such features can include contextual features (such as information pertaining to temporal aspects such as summer, winter, January, weekends, etc.), statistical features (including mean, median, standard deviation, interquartile range (IQR), etc.), and time scale features (including hourly, daily, weekly, monthly, etc.).

The features determination component 204 forwards one or more features determined from the noted input data to an analytics engine 206, which carries out one or more multi-layered statistical and machine learning algorithms (such as component 102 in FIG. 1) and outputs a non-technical loss detection component 208, which identifies one or more anomalous consumers within the network whose behavior in consuming electricity is unexpected and/or different from similar type of consumers, and/or who are the cause of one or more non-technical losses.

Figure 3:
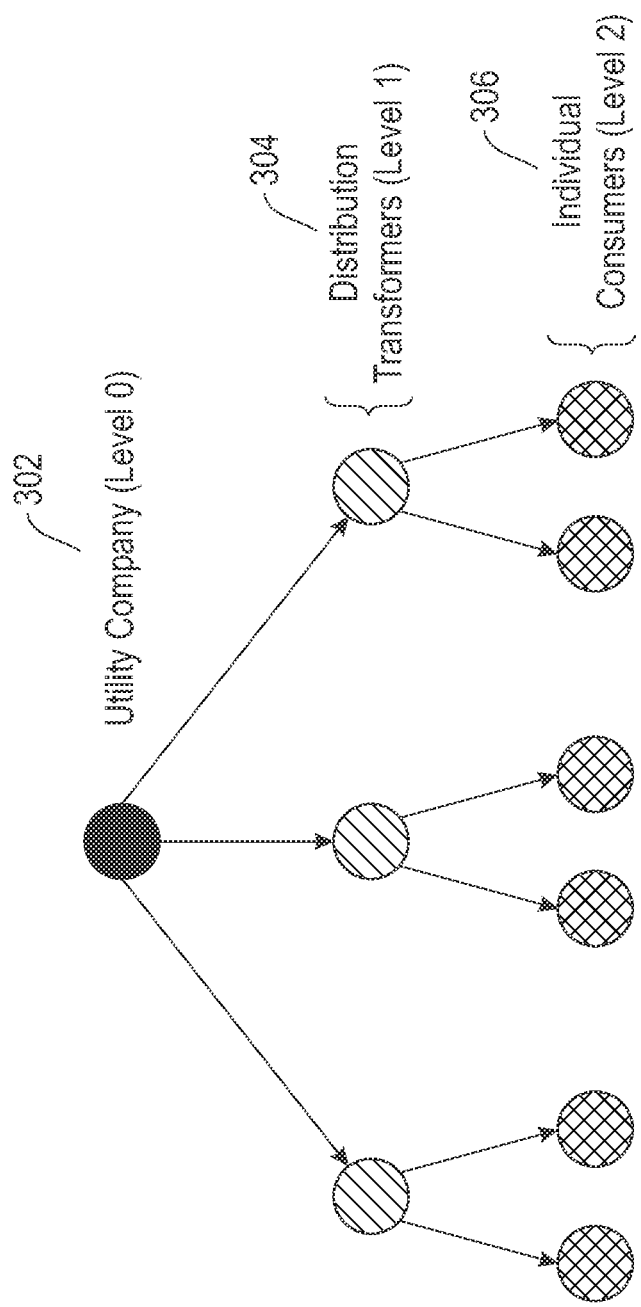
FIG. 3 is a tree diagram illustrating a distribution network, according to an example embodiment of the invention.

FIG. 3 is a tree diagram illustrating a distribution network, according to an example embodiment of the invention. As noted herein, FIG. 3 depicts a tree diagram of an electrical distribution network that includes a utility company 302 (referred to as Level 0), distribution transformers 304 (referred to as Level 1), and individual consumers 306 (referred to as Level 2).

Figure 4:
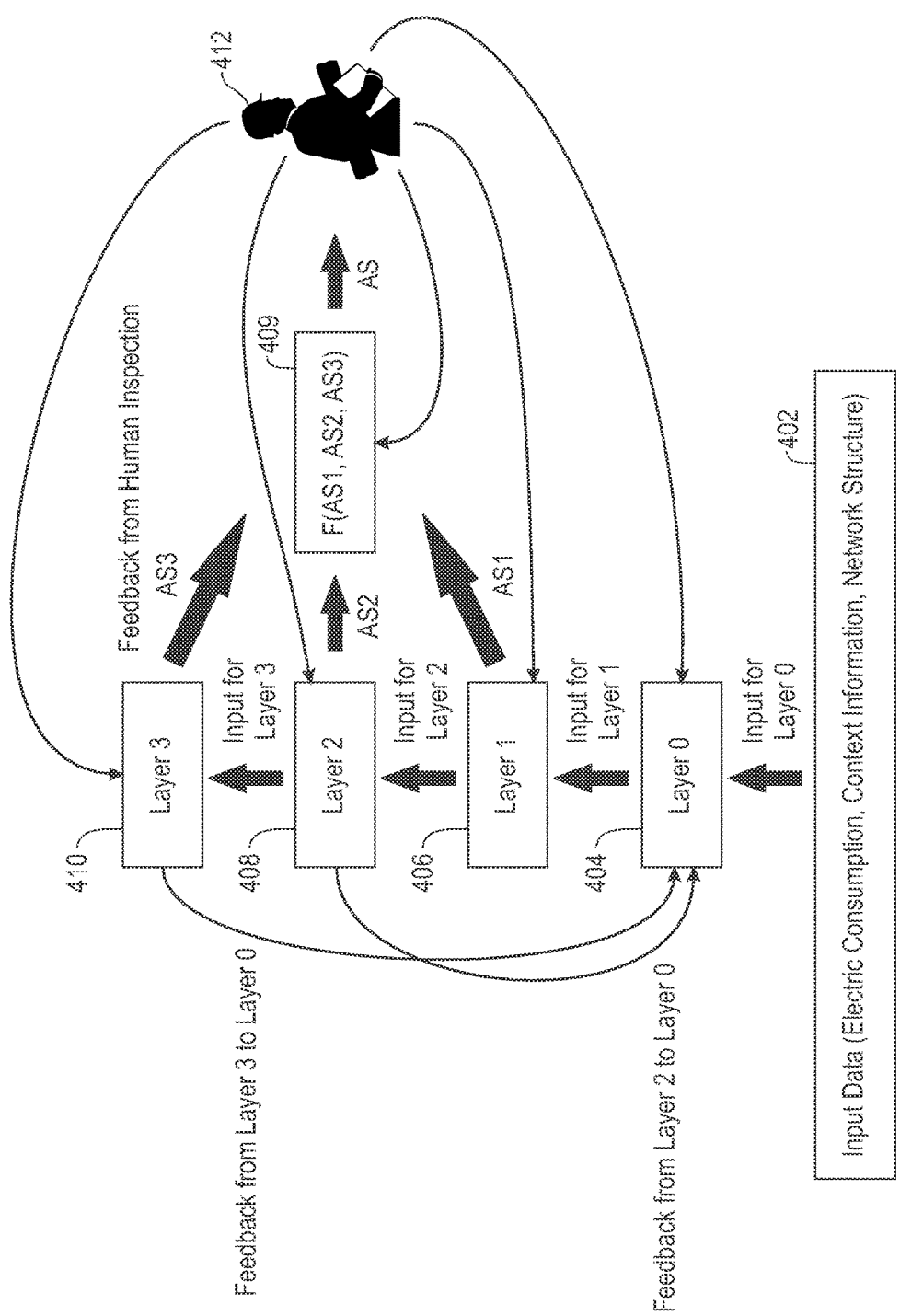
FIG. 4 is a diagram illustrating an example embodiment of the invention.

FIG. 4 is a diagram illustrating an example embodiment of the invention. By way of illustration, FIG. 4 depicts input data 402 (such as electric consumption data, context information, network structure information, etc.), which is provided as input to Layer 0 component 404. Layer 0 component 404 provides input to Layer 1 component 406. Layer 1 component 406 provides input to Layer 2 component 408, and Layer 2 component 408 provides input to Layer 3 component 410. The actions and outputs of these layers is discussed further below.

As also depicted in FIG. 4, the Layer 1 component 406, the Layer 2 component 408, and the Layer 3 component 410 provide anomaly scores (AS) AS1, AS2, and AS3, respectively, to an algorithm component 409. The algorithm component 409, as further detailed herein, generates a final anomaly score as a function of the provided input anomaly scores, namely, F(AS1, AS2, AS3), and outputs the final AS to a user 412 (such as a human inspector). The user 412 analyzes the final AS and provides feedback, based on that analysis, to the Layer 0 component 404, the Layer 1 component 406, the Layer 2 component 408, the Layer 3 component 410, and the algorithm component 409. Feedback from human inspection can indicate, for example, if the anomaly detected by the system is a true anomaly (+1) or a false positive (−1, not an anomaly in actuality).

In at least one embodiment of the invention, training data (AS1, AS2, AS3) as well as binary feedback labels are input to a learning algorithm, and weights (a1, a2, a3) are output. Binary feedback labels can include the following: "+1" indicates a true positive (that is, the anomaly detected by the system is an anomaly in actuality), and "−1" indicates a false positive (that is, the anomaly detected by the system is not an anomaly in actuality). As such, the weights (a1, a2 and a3) can be learned and/or determined by the learning algorithm based on the binary feedback labels generated by the human inspection procedure. Accordingly, a function (such as implemented, for example, via algorithm component 409) can be transformed to a weighted function as a result of human inspection feedback. By way of illustration, function F(AS1, AS2, AS3) can be transformed to weighted function F((a1*AS1)+(a2*AS2)+(a3*AS3)). Weights can represent, for example, a level of relative importance, which can be learned over time.

Accordingly, as detailed in one or more examples above, at least one embodiment of the invention includes implementation of a function F which combines the values of AS1, AS2 and AS3 to generate a single AS for a node in the tree distribution network. Also, in one or more embodiments of the invention, if the value of AS for some consumer is greater than a given threshold (indicating a high possibility of being an anomaly), a manual inspection can be carried out by the utility. As described herein, feedback from such an inspection (an indication of the AS being a true or false positive, for instance) can be implemented to minimize the false positive rate in future iterations of one or more embodiments of the invention. For example, one or more embodiments of the invention can include learning weights and/or parameters of the function F based on such feedback in a supervised setting. Accordingly, in such an embodiment, the overall performance of the function can improve over time.

Additionally, as also illustrated in FIG. 4, the Layer 3 component 410 and the Layer 2 component 408 each provide feedback to the Layer 0 component 404. By way of example, if there is any discrepancy between the results of Layer 1 and Layer 2 (or Layer 3), that information is passed from Layer 2 (or Layer 3) to Layer 0 (which is carrying out the load forecasting part as the basis of generating anomaly score 1 from Layer 1). Layer 1 computes the anomaly score based on the results of Layer 0, so there is no feedback path from Layer 1 to Layer 0. If, for example, there is some sudden change of weather (context) which drives all of the consumers in a segment to change their consumption pattern, then this change of context can be adjusted into the forecasting model based on the feedback from the other layers. By way of example, feedback from Layer 2 and Layer 3 to Layer 0 can be utilized to improve the performance of the load forecasting module at Layer 0. Such feedback can be used to adjust the forecasting model in instances such as, for example, there is a significant difference in the value of AS1 to that of AS2 and AS3.

As further detailed herein, at least one embodiment of the invention includes loss detection based on self-consumption data via an anomaly score calculation by Layer 0 component 404. Additionally, one or more embodiments of the invention can also include loss detection based on analysis of a group of consumers, and over different time intervals via an anomaly score calculation by Layer 2 component 408 and Layer 3 component 410. As also depicted in FIG. 4, at least one embodiment of the invention can include implementation of human inspection feedback (such as from user 412) to minimize the false positive rates via a feedback path, for example, from human inspection to an aggregation function (such as in component 409).

As also described herein, at least one embodiment of the invention includes analyzing data with respect to peers and/or within a given consumer group, analyzing with respect to past consumption data (such as a change in consumption over time, analyzed using error in load prediction), and/or analyzing with distribution transformer (DT) level meter data (wherein a discrepancy in DT level metering data and smart meters aggregated data provide higher confidence anomalies).

In connection with the example embodiment of the invention illustrated in FIG. 4, actions carried out by the Layer 0 component 404 can include detecting the location of possible anomalies based on the network structure and energy flow information, as well as predicting and/or determining the expected load for individual consumers based on past consumption data of those individual consumers.

If the tree structure of the distribution network and consumption data at Level 0 and Level 1 (as depicted in FIG. 3) are available, at least one embodiment of the invention includes taking the consumption values from different levels of the distribution network and determining the difference between the energy supplied by a given parent node (in the network) and the sum of the energy consumed by the children nodes (of the given parent node). If the difference is greater than a given threshold value (representative of technical losses, for example), at least one embodiment of the invention includes analyzing one or more sub-trees under that parent node for possible anomalies. Otherwise (that is, if the difference is less than the given threshold value), then such an embodiment of the invention includes analyzing all of the consumer nodes for possible anomalies.

Additionally, actions carried out by the Layer 0 component 404 can also include predicting the electric consumption of given consumer nodes (under consideration) based on analysis of context information (such as weather information and/or calendar information, for example) and demographic information, if available.

Referring again to the example embodiment of the invention illustrated in FIG. 4, actions carried out by the Layer 1 component 406 can include detecting possible anomalies based on the difference between actual and expected energy consumption. Such detection can include determining the average difference between actual consumption and predicted consumption over some x consecutive days, and computing an anomaly score (namely, AS1) based on this average difference.

Further, in the example embodiment of the invention illustrated in FIG. 4, actions carried out by the Layer 2 component 408 can include detecting possible anomalies based on the distance of a consumption pattern of a given consumer from a consumption pattern associated with the center of the consumer's respective cluster. Such an embodiment includes clustering all consumers of the network into one or more clusters based on one or more similarity measures associated with the consumption pattern of each consumer at some point of time t. Euclidean distance can be used as an example measure of similarity, and the "center" of a cluster is some cluster representative. For k-means clustering algorithm, the mean of all points inside of the cluster can be utilized. Subsequently, as noted, such an embodiment can include determining the level of deviation of a consumption pattern of each of the consumers in a given cluster from a consumption pattern associated with the center of the given cluster. Accordingly, an anomaly score (namely, AS2) can be computed based on this deviation.

As noted, one or more embodiments of the invention include implementing one or more algorithms to cluster a set of consumers based on the electricity consumption associated with each of the consumers. Such an embodiment can include, for example, selecting initial seeds such that a consistent set of clusters can be obtained on different runs of the one or more algorithms, and/or implementing one or more clustering algorithms that are independent of the initial seeds.

Referring again to the example embodiment of the invention illustrated in FIG. 4, actions carried out by the Layer 3 component 410 can include detecting possible anomalies based on the evolution of one or more clusters over time. Such an embodiment can include clustering all of the consumers (into one or more clusters) based on one or more similarity measures associated with the consumption pattern of each consumer throughout the time interval from t-h to t, and also clustering all of the consumers (into one or more clusters) based on one or more similarity measures associated with the consumption pattern of each consumer throughout the time interval from t to t+h. Further, such an embodiment can include matching clusters generated across the two iterations of clustering. If a given cluster $C_k$ from the first clustering matches a given cluster $C_l$ from the second clustering, and a consumer which belongs to $C_k$ at the first clustering belongs to a cluster other than $C_l$ in the second clustering, at least one embodiment of the invention includes determining that the evolution pattern of that consumer is different from other consumers. Accordingly, an anomaly score (namely, AS3) can be computed based on the determined evolution pattern(s).

As detailed above, anomaly scores can be computed at each of Layer 1, Layer 2, and Layer 3. For Layer 1, an AS can be proportional to the difference (diff) between actual and expected energy consumption. Accordingly, $AS1=w1*diff$, wherein $w1>0$ and is a constant that can be used to control the range of the AS. For Layer 2, an AS can be proportional to the deviation (dev) of a consumption pattern of each of the consumers in a given cluster from a consumption pattern associated with the center of the given cluster. Accordingly, $AS2=w2*dev$, wherein $w2>0$ and is a constant that can be used to control the range of the AS.

For Layer 3, if P ($n \times K_1$) is the belongingness matrix (in soft clustering) for a first time interval, Q ($n \times K_2$) is the belongingness matrix for a second time interval, and S ($K_1 \times K_2$) is the similarity matrix, then an outlier score for the ith consumer is $AS3=w3*\Sigma_{j=1}^{K2} (Q_{ij}-P_i \odot S_{\cdot j})$, wherein n is the total number of consumers, $K_1$ and $K_2$ are the number of clusters for the first and the second interval, respectively, and $\odot$ is the dot product between two vectors. As noted herein, in a soft clustering context, the $(i,j)^{th}$ entry of the "belongingness" matrix is the probability that the $i^{th}$ object belongs to $j^{th}$ cluster in the clustering.

Figure 5:
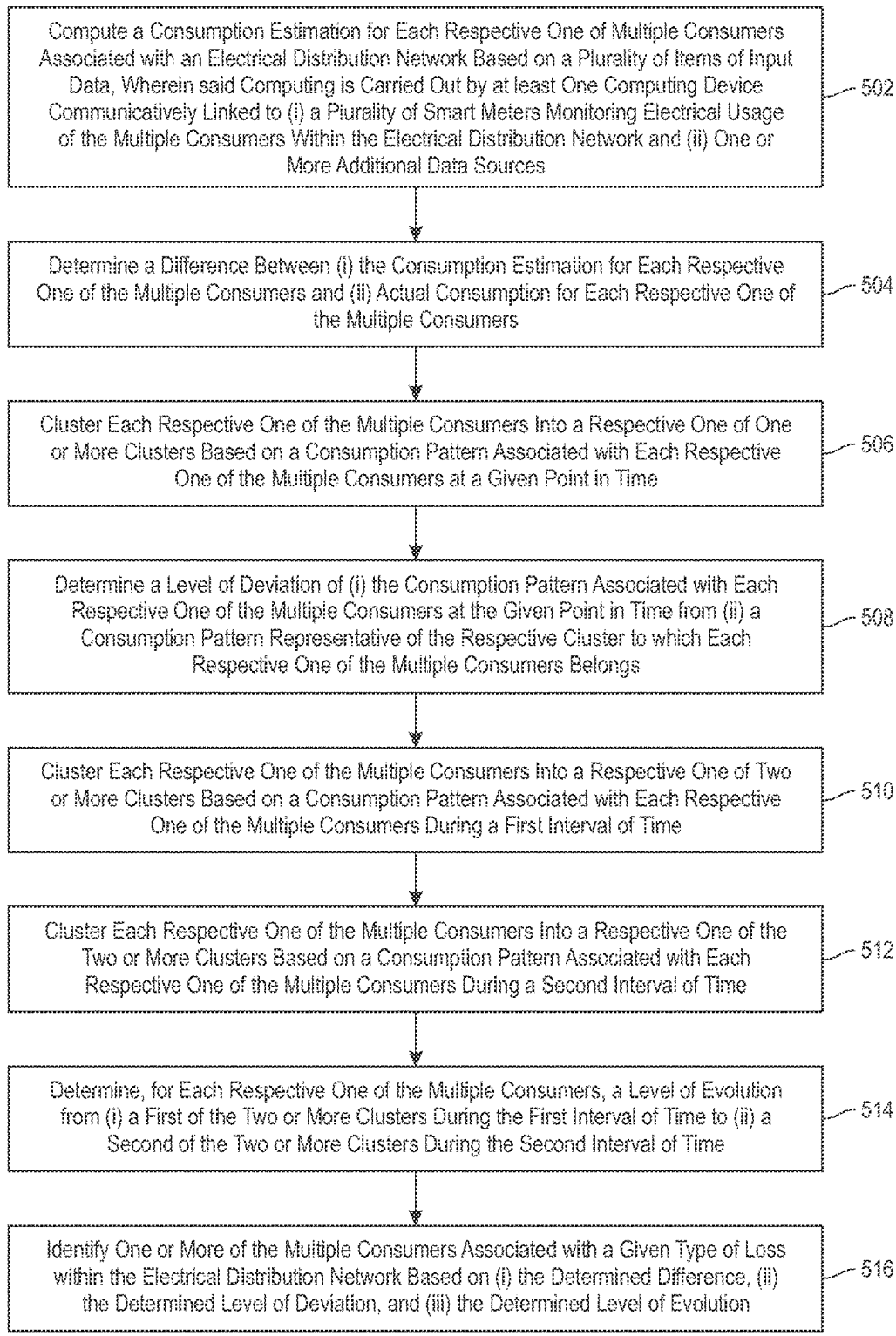
FIG. 5 is a flow diagram illustrating techniques according to an embodiment of the invention.

FIG. 5 is a flow diagram illustrating techniques according to an embodiment of the present invention. Step 502 includes computing a consumption estimation for each of multiple consumers associated with an electrical distribution network based on a plurality of items of input data, wherein said computing is carried out by at least one computing device communicatively linked to (i) a plurality of smart meters monitoring electrical usage of the multiple consumers within the electrical distribution network and (ii) one or more additional data sources. The plurality of items of input data can include smart meter data for each of the multiple consumers, real-time energy consumption data derived from one or more distribution transformers within the electrical distribution network, calendar context information, weather context information, consumer demographic information, and/or information pertaining to structure of the electrical distribution network.

Step 504 includes determining a difference between (i) the consumption estimation for each of the multiple consumers and (ii) actual consumption for each of the multiple consumers.

Step 506 includes clustering the multiple consumers into one or more clusters based on a consumption pattern associated with each of the multiple consumers at a given point in time. Step 508 includes determining a level of deviation of (i) the consumption pattern associated with each of the multiple consumers at the given point in time from (ii) a consumption pattern representative of the cluster to which each of the multiple consumers belongs. The consumption pattern representative of the cluster to which each of the multiple consumers belongs can include an average consumption pattern calculated across the cluster to which each of the multiple consumers belongs.

Step 510 includes clustering the multiple consumers into two or more clusters based on a consumption pattern associated with each of the multiple consumers during a first interval of time. Step 512 includes clustering the multiple consumers into the two or more clusters based on a consumption pattern associated with each of the multiple consumers during a second interval of time. Step 514 includes determining, for each of the multiple consumers, a level of evolution from (i) a first of the two or more clusters during the first interval of time to (ii) a second of the two or more clusters during the second interval of time.

Step 516 includes identifying one or more of the multiple consumers associated with a given type of loss within the electrical distribution network based on (i) the determined difference, (ii) the determined level of deviation, and (iii) the determined level of evolution. The given type of loss comprises a non-technical loss.

Identifying can include computing a score for each of the multiple consumers based on (i) the determined difference, (ii) the determined level of deviation, and (iii) the determined level of evolution. The score represents the given type of loss if the score is greater than a given threshold value. Also, in at least one embodiment of the invention, computing the score includes applying a discrete weight to each of (i) the determined difference, (ii) the determined level of deviation, and (iii) the determined level of evolution.

The techniques depicted in FIG. 5 can also include implementing a feedback mechanism. Additionally, the feedback mechanism can include a human inspection of at least one of (i) the one or more of the multiple consumers associated with a non-technical loss within the electrical distribution network, (ii) the determined difference, (iii) the determined level of deviation, and (iv) the determined level of evolution. Further, one or more embodiments of the invention can include modifying, based on feedback derived from said feedback mechanism, at least one of (i) the one or more of the multiple consumers associated with a non-technical loss within the electrical distribution network, (ii) the determined difference, (iii) the determined level of deviation, and (iv) the determined level of evolution.

The techniques depicted in FIG. 5 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIG. 5 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

Additionally, an embodiment of the present invention can make use of software running on a computer or workstation.

Figure 6:
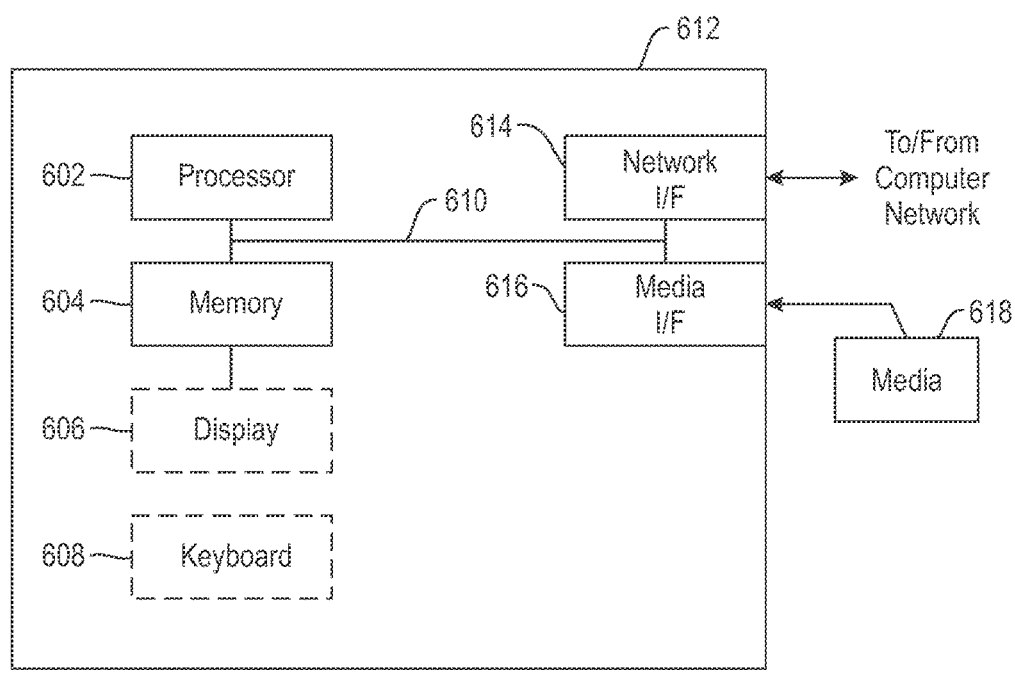
FIG. 6 is a system diagram of an exemplary computer system on which at least one embodiment of the invention can be implemented.

With reference to FIG. 6, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 612 as shown in FIG. 6) running a server program. It will be understood that such a physical server may or may not include a display and keyboard.

As will be appreciated by one skilled in the art, embodiments of the present invention may be embodied as a system, method and/or computer program product. Accordingly, embodiments of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, as noted herein, embodiments of the present invention may take the form of a computer program product that may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (for example, light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a special purpose computer or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 602. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICS), functional circuitry, an appropriately programmed digital computer with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

At least one embodiment of the present invention may provide a beneficial effect such as, for example, utilizing statistical and/or machine learning techniques in connection with an electrical distribution network to detect anomalies.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:

computing a consumption estimation for each of multiple consumers associated with an electrical distribution network based on a plurality of items of input data, wherein said computing is carried out by at least one computing device communicatively linked to (i) a plurality of smart meters monitoring electrical usage of the multiple consumers within the electrical distribution network and (ii) one or more additional data sources;

determining a difference between (i) the consumption estimation for each of the multiple consumers and (ii) actual consumption for each of the multiple consumers;

clustering the multiple consumers into one or more clusters based on a consumption pattern associated with each of the multiple consumers at a given point in time;

determining a level of deviation of (i) the consumption pattern associated with each of the multiple consumers at the given point in time from (ii) a consumption pattern representative of the cluster to which each of the multiple consumers belongs;

clustering the multiple consumers into two or more clusters based on a consumption pattern associated with each of the multiple consumers during a first interval of time;

clustering the multiple consumers into the two or more clusters based on a consumption pattern associated with each of the multiple consumers during a second interval of time;

determining, for each of the multiple consumers, a level of evolution from (i) a first of the two of more clusters during the first interval of time to (ii) a second of the two or more clusters during the second interval of time;

identifying one or more of the multiple consumers associated with a given type of loss within the electrical distribution network based on (i) the determined difference, (ii) the determined level of deviation, and (iii) the determined level of evolution; and implementing a feedback mechanism, wherein the feedback mechanism comprises inspection of at least one of (i) the one or more of the multiple consumers associated with a non-technical loss within the electrical distribution network, (ii) the determined difference, (iii) the determined level of deviation, and (iv) the determined level of evolution.

2. The method of claim 1, wherein said plurality of items of input data comprises at least smart meter data for each of the multiple consumers.

3. The method of claim 1, wherein said plurality of items of input data comprises at least real-time energy consumption data derived from one or more distribution transformers within the electrical distribution network.

4. The method of claim 1, wherein said plurality of items of input data comprises at least calendar context information.

5. The method of claim 1, wherein said plurality of items of input data comprises at least weather context information.

6. The method of claim 1, wherein said plurality of items of input data comprises at least consumer demographic information.

7. The method of claim 1, wherein said plurality of items of input data comprises at least information pertaining to structure of the electrical distribution network.

8. The method of claim 1, wherein said identifying comprises computing a score for each of the multiple consumers based on (i) the determined difference, (ii) the determined level of deviation, and (iii) the determined level of evolution.

9. The method of claim 8, wherein the score represents the given type of loss if the score is greater than a given threshold value.

10. The method of claim 8, wherein said computing the score comprises applying a discrete weight to each of (i) the determined difference, (ii) the determined level of deviation, and (iii) the determined level of evolution.

11. The method of claim 1, comprising:
modifying, based on feedback derived from said feedback mechanism, at least one of (i) the one or more of the multiple consumers associated with a non-technical loss within the electrical distribution network, (ii) the determined difference, (iii) the determined level of deviation, and (iv) the determined level of evolution.

12. The method of claim 1, wherein the consumption pattern representative of the cluster to which each of the multiple consumers belongs comprises an average consumption pattern calculated across the cluster to which each of the multiple consumers belongs.

13. The method of claim 1, wherein the given type of loss comprises a non-technical loss.

14. A computer program product, the computer program product comprising a computer readable storage medium having program instructions embodied therewith, the program instructions executable by a computing device to cause the computing device to:

compute a consumption estimation for each of multiple consumers associated with an electrical distribution network based on a plurality of items of input data, wherein said computing is carried out by at least one computing device communicatively linked to (i) a plurality of smart meters monitoring electrical usage of the multiple consumers within the electrical distribution network and (ii) one or more additional data sources;

determine a difference between (i) the consumption estimation for each of the multiple consumers and (ii) actual consumption for each of the multiple consumers;

cluster the multiple consumers into one or more clusters based on a consumption pattern associated with each of the multiple consumers at a given point in time;

determine a level of deviation of (i) the consumption pattern associated with each of the multiple consumers at the given point in time from (ii) a consumption pattern representative of the cluster to which each of the multiple consumers belongs;

cluster the multiple consumers into two or more clusters based on a consumption pattern associated with each of the multiple consumers during a first interval of time;

cluster the multiple consumers into the two or more clusters based on a consumption pattern associated with each of the multiple consumers during a second interval of time;

determine, for each of the multiple consumers, a level of evolution from (i) a first of the two of more clusters during the first interval of time to (ii) a second of the two or more clusters during the second interval of time;

identify one or more of the multiple consumers associated with a given type of loss within the electrical distribution network based on (i) the determined difference, (ii) the determined level of deviation, and (iii) the determined level of evolution; and implement a feedback mechanism, wherein the feedback mechanism comprises inspection of at least one of (i) the one or more of the multiple consumers associated with a non-technical loss within the electrical distribution network, (ii) the determined difference, (iii) the determined level of deviation, and (iv) the determined level of evolution.

15. The computer program product of claim 14, wherein said identifying comprises computing a score for each of the multiple consumers based on (i) the determined difference, (ii) the determined level of deviation, and (iii) the determined level of evolution.

16. The computer program product of claim 15, wherein said computing the score comprises applying a discrete weight to each of (i) the determined difference, (ii) the determined level of deviation, and (iii) the determined level of evolution.

17. A system comprising:
a memory; and
at least one processor coupled to the memory and configured for:
computing a consumption estimation for each of multiple consumers associated with an electrical distribution network based on a plurality of items of input data, wherein said computing is carried out by at least one computing device communicatively linked to (i) a plurality of smart meters monitoring electrical usage of the multiple consumers within the electrical distribution network and (ii) one or more additional data sources;

determining a difference between (i) the consumption estimation for each of the multiple consumers and (ii) actual consumption for each of the multiple consumers;

clustering the multiple consumers into one or more clusters based on a consumption pattern associated with each of the multiple consumers at a given point in time;

determining a level of deviation of (i) the consumption pattern associated with each of the multiple consumers at the given point in time from (ii) a consumption pattern representative of the cluster to which each of the multiple consumers belongs;

clustering the multiple consumers into two or more clusters based on a consumption pattern associated with each of the multiple consumers during a first interval of time;

clustering the multiple consumers into the two or more clusters based on a consumption pattern associated with each of the multiple consumers during a second interval of time;

determining, for each of the multiple consumers, a level of evolution from (i) a first of the two of more clusters during the first interval of time to (ii) a second of the two or more clusters during the second interval of time;

identifying one or more of the multiple consumers associated with a given type of loss within the electrical distribution network based on (i) the determined difference, (ii) the determined level of deviation, and (iii) the determined level of evolution; and implementing a feedback mechanism, wherein the feedback mechanism comprises inspection of at least one of (i) the one or more of the multiple consumers associated with a non-technical loss within the electrical distribution network, (ii) the determined difference, (iii) the determined level of deviation, and (iv) the determined level of evolution.

* * * * *